United States Patent
Chen et al.

(10) Patent No.: US 7,402,212 B2
(45) Date of Patent: Jul. 22, 2008

(54) APPARATUS AND METHOD FOR CLEANING A GLASS SUBSTRATE BEFORE PHOTORESIST COATING

(75) Inventors: Wei-Ting Chen, Taipei (TW); Man-Hung Wu, Taipei Hsien (TW); Hung-Yi Cheng, Taichung (TW)

(73) Assignee: Au Optronics Corp., Hsinchu (TW)

( * ) Notice: Subject to any disclaimer, the term of this patent is extended or adjusted under 35 U.S.C. 154(b) by 33 days.

(21) Appl. No.: 10/414,110

(22) Filed: Apr. 16, 2003

(65) Prior Publication Data

US 2004/0118429 A1  Jun. 24, 2004

(30) Foreign Application Priority Data

Dec. 20, 2002 (TW) .............................. 91136860 A

(51) Int. Cl.
*C08C 23/00* (2006.01)
*C23G 1/14* (2006.01)

(52) U.S. Cl. .............................. 134/29; 134/2; 134/26; 134/27

(58) Field of Classification Search ...................... 134/2, 134/26, 29, 30, 902, 3, 27, 28
See application file for complete search history.

(56) References Cited

U.S. PATENT DOCUMENTS

| | | | |
|---|---|---|---|
| 5,881,750 A | * | 3/1999 | Yoshitani ................ 156/345.23 |
| 5,980,643 A | * | 11/1999 | Jolley ............................. 134/2 |
| 6,526,995 B1 | * | 3/2003 | Hackenberg ................. 134/1.3 |
| 6,531,436 B1 | * | 3/2003 | Sahbari et al. .............. 510/176 |

\* cited by examiner

*Primary Examiner*—Jill Warden
*Assistant Examiner*—Saeed Chaudhry
(74) *Attorney, Agent, or Firm*—Troxell Law Office, PLLC

(57) ABSTRACT

A method for cleaning a glass substrate before photoresist coating, which method can remove oxide compounds and organic residues from the surface of a metal layer of the glass substrate, comprises the steps of firstly providing an alkaline developer in a concentration of between 0.35% and 0.45%; later immersing the metal film of the glass substrate in the alkaline developer; then rinsing the metal film of the glass substrate after immersed with clean water; and lastly having the surface of the metal film of the glass substrate in a dry treatment.

11 Claims, 3 Drawing Sheets

APPARATUS AND METHOD FOR CLEANING A GLASS SUBSTRATE BEFORE PHOTORESIST COATING

FIELD OF THE INVENTION

The present invention relates to a method and an apparatus for cleaning a glass substrate, and more particularly, to a method and an apparatus for rinsing oxide compounds and organic residues on the surface of a metal film before a glass substrate is coated with a photoresist.

BACKGROUND OF THE INVENTION

With rapid advancement of the fabrication technology of thin film transistor liquid crystal displays (TFT-LCDs), the LCD is largely applied in various electronic products such as a Personal Digital Assistant (PDA) device, a notebook computer, a digital camera, a video camera, and a mobile phone due to the fact it has advantages of smaller size, lighter weight, lower power consumption and low radiation. Moreover, since manufacturers aggressively invest in research & development and employ large-scale fabricating equipment, the quality of the LCD is unceasingly improved and the price thereof is continuously decreased. That promptly broadens the applied fields of the LCD.

Referring to FIG. 1, it shows a sectional view of a thin film transistor formed on a glass substrate in the prior art. The manufacturing process for the thin film transistor includes firstly forming a gate metal film on the glass substrate 10, wherein the gate metal film is made of aluminum or aluminum alloy material and is formed by sputtering deposition; then performing a first photo engraving process (PEP) for the gate metal film to define a gate structure 12 and metal line structures (not shown); subsequently covering the surface of the above-mentioned structures with an insulating layer 14 by a CVD process; sequentially forming a semiconductor layer 16 and a doped semiconductor layer 18 above the gate structure 12; afterwards, performing a second PEP for the semiconductor layer 16 and the doped semiconductor layer 18; subsequently forming a source/drain metal film on the doped semiconductor layer 18 and the insulating layer 14, wherein the source/drain metal film is a composite metal film made of a tri-layer metal molybdenum/aluminum/molybdenum and is formed by a CVD process; then performing a third PEP to respectively define a source structure and a drain structure 20 on the metal film and thus to define the thin film transistor on the surface of the glass substrate.

A cleaning procedure is further included in the steps of the above-mentioned process, especially the cleaning procedure performed before a photoresist is coated on the metal film of the glass substrate during the first and third PEPs. The cleaning procedure is used to remove particles of oxides and organics remained on the surface of the metal film so that coated photoresist patterns will not result in defects or disconnections. Furthermore, the organic residuals also reduce the adhesion of the photoresist to result in peeling. Hence, to the fabrication process of the THT-LCD, the cleaning process is one of the most important factors for process yield.

Referring to FIG. 2, which is a schematic diagram of a conventional scrubber before the glass substrate is coated with the photoresist, a scrubber 21 of the fifth generation TFT-LCD is exemplified. During cleaning the glass substrate 22, a delivering band 23 is used to transport the glass substrate 22 to a rinse unit 24. Three clean water nozzles 25 mounted on the top of the delivering band 23 at the rinse unit 24 are used to rinse out the glass substrate 22. After completion of rinsing, the glass substrate 22 is transported out by the delivering band 23. The rinsed glass substrate 22 is under a dry treatment with an air scraper 26. The clean water nozzles 25 are respectively connected to a deionized water supply source 27 with pipelines and rinse the glass substrate 22 in a manner of high pressure spraying in combination with a mega sonic wave. Moreover, a recycling pipeline 28 further disposed below the rinse unit 24 can recycle excess deionized water from the clean water nozzles 25 during the glass substrate 22 is rinsed.

However, the conventional scrubber and the cleaning method thereof cannot remove the organics and oxides on the surface of the metal film of the glass substrate and the formed photoresist patterns still have defects, disconnections and peelings. Therefore, those skilled in the art of photoelectric related industries endeavor to research and develop processes as well as to improve equipment so as to provide a method which can remove the organic and oxide residuals from the surface of the metal film of the glass substrate and solve the problems of the prior art.

SUMMARY OF THE INVENTION

The primary objective of the present invention is to provide a method for cleaning a glass substrate before photoresist coating, which method can remove oxide compounds and organic residues from the surface of a metal layer of the glass substrate so as to prevent the coated photoresist patterns from resulting in defects, disconnections and peelings.

The second objective of the present invention is to provide an apparatus for cleaning a glass substrate before photoresist coating, which apparatus can remove oxide compounds and organic residues from the surface of a metal layer of the glass substrate so as to prevent the coated photoresist patterns from resulting in defects, disconnections and peelings.

The cleaning method disclosed in this invention includes the steps of firstly providing an alkaline developer which has tetramethylammonium hydroxide (TMAH) as the main component, in a concentration of between 0.35% and 0.45%; later immersing a metal film of the glass substrate in the alkaline developer; then rinsing the metal film of the glass substrate after immersed with clean water in a manner of high pressure spraying in combination with a mega sonic wave; and lastly having the surface of the metal film of the glass substrate in a dry treatment with an air scraper. In the step of immersing, a preferred immersing time is between 30 and 50 seconds considering material and time costs, an appropriate cleaning effect and the other related factors, so as to have a complete reaction of the alkaline developer with the oxides and organics on the surface of the metal film.

Furthermore, the cleaning apparatus of this invention comprises a developer nozzle, a set of clean water nozzles, a delivering band, a recycling pipeline and an air scraper, wherein the developer nozzle is connected to a developer supply source through pipelines and provides a developer desired for cleaning the glass substrate; the set of clean water nozzles is connected to a clean water supply source and rinses the glass substrate in a manner of high pressure spraying in combination with a mega sonic wave; the delivering band can carry the glass substrate to first pass the developer nozzle for developer immersing and then to pass the set of clean water nozzles for clean water rinsing; the recycling pipeline can recycle excess liquids during the glass substrate is cleaned; and the air scraper is used to dry the surface of the metal film after completion of rinsing the glass substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method and an apparatus for cleaning a glass substrate before photoresist coating, characterized in that the method can remove oxide compounds and organic residues on the surface of a metal layer of the glass substrate. The best mode and the practicing thereof are described below in detail.

Figure 3:
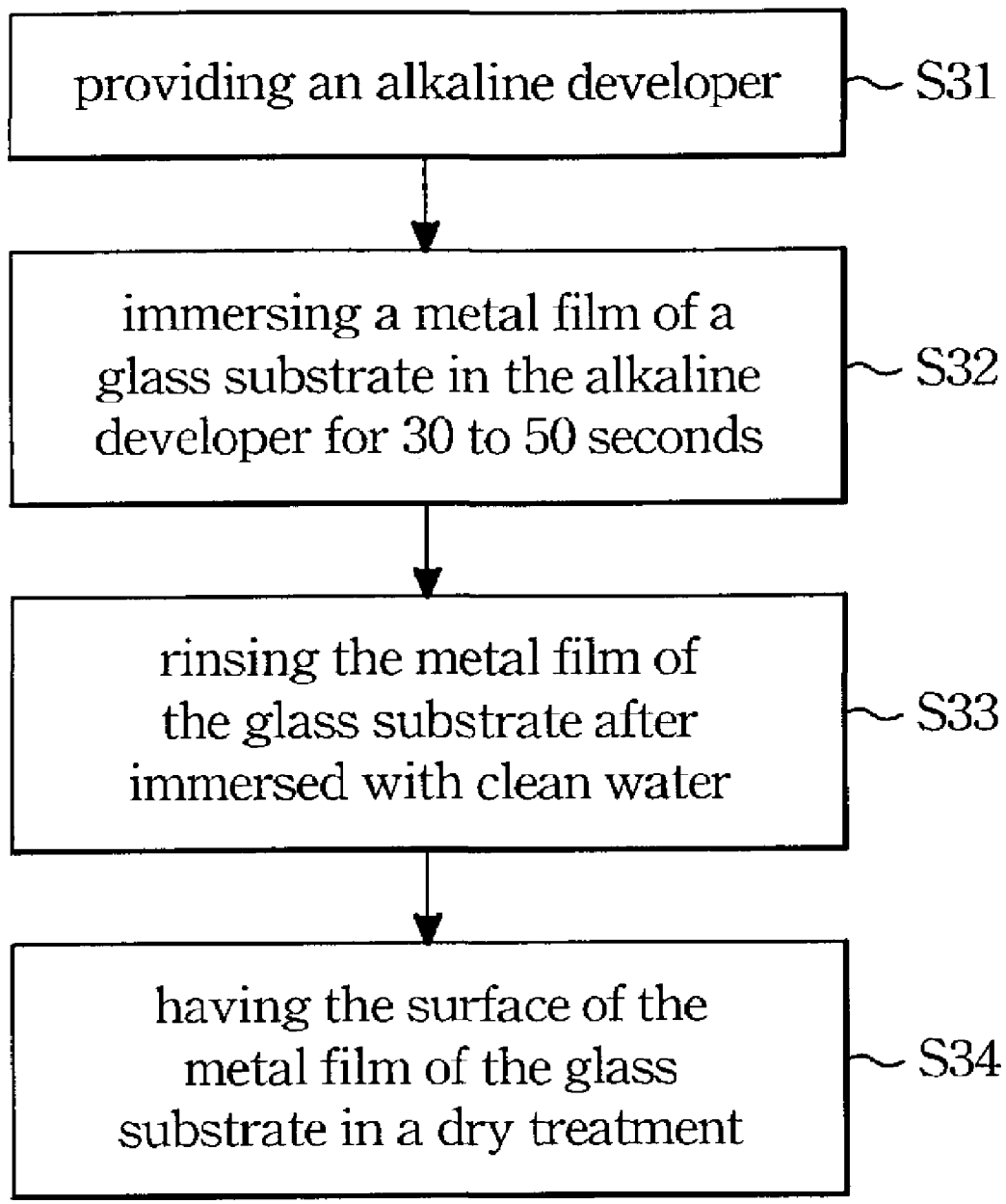
FIG. 3 is a flow chart of a method for cleaning a glass substrate before photoresist coating in accordance with this invention.

Referring to FIG. 3, it is a flow chart of the method for cleaning a glass substrate before photoresist coating in accordance with this invention. The steps of the method includes firstly providing an alkaline developer which has tetramethylammonium hydroxide (TMAH) as the main component, in a concentration of between 0.35% and 0.45% (S31); later immersing a metal film of the glass substrate in the alkaline developer for a time of preferably between 30 and 50 seconds so as to have a complete reaction of the alkaline developer with the oxides and organics on the surface of the metal film (S32); then rinsing the metal film of the glass substrate after immersed with clean water in a manner of high pressure spraying in combination with a mega sonic wave (S33); and lastly having the surface of the metal film of the glass substrate in a dry treatment with an air scraper (S34).

Figure 4:
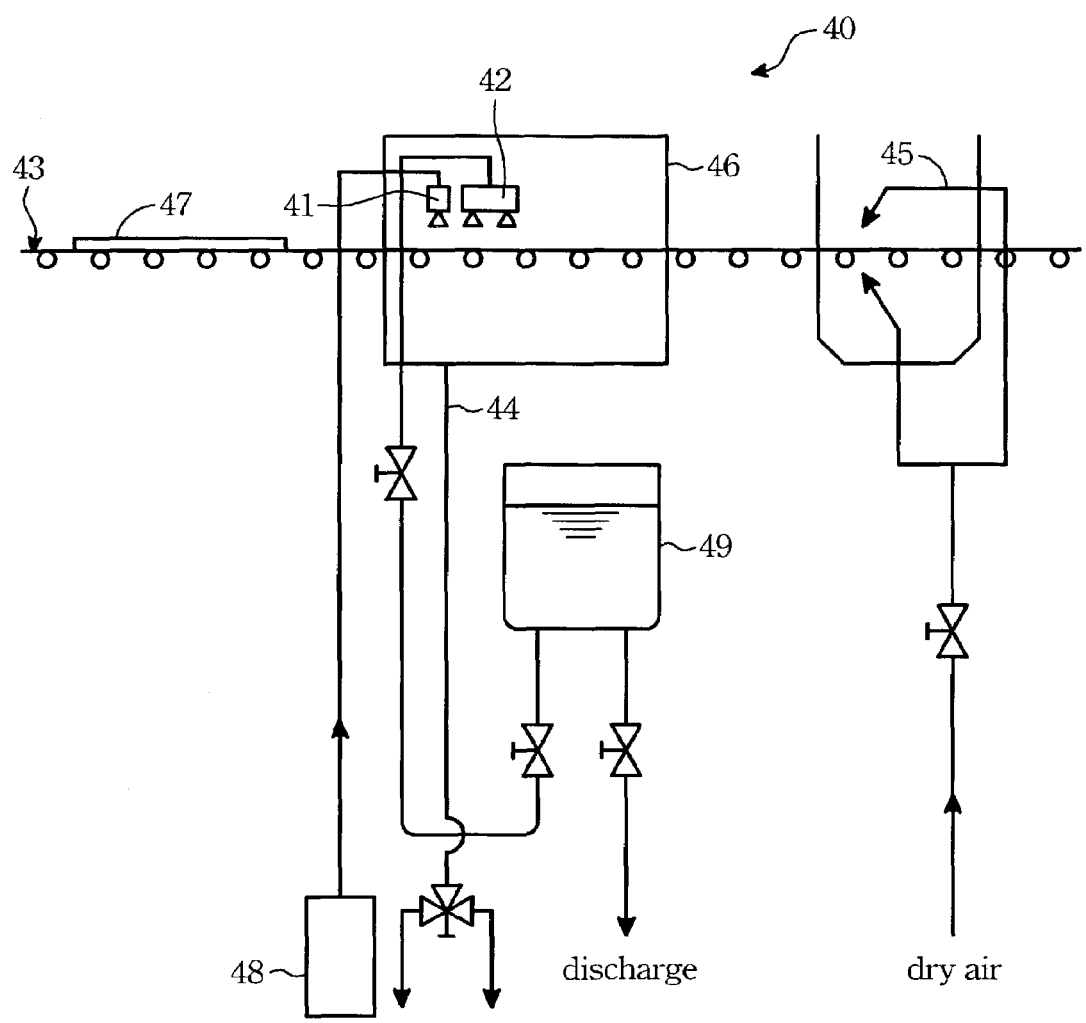
FIG. 4 is a schematic diagram of an apparatus for cleaning the glass substrate before photoresist coating in accordance with this invention.

Further, referring to FIG. 4, it shows a schematic diagram of the apparatus for cleaning the glass substrate before photoresist coating in accordance with this invention. In order to complete the above-mentioned cleaning process and remove the oxide and organic residuals from the glass substrate, the cleaning apparatus of this invention comprises one developer nozzle 41, two clean water nozzles 42, a delivering band 43, a recycling pipeline 44 and an air scraper 45, wherein the developer nozzle 41 and the two clean water nozzles 42 constitute a rinse unit 46, and the delivering band 43 can transport a glass substrate 47 to the rinse unit 46 for rinsing and then transport the glass substrate 47 to the air scraper 45 for drying.

In FIG. 4, the developer nozzle 41 is connected to a developer supply source 27 through pipelines and the developer supply source 27 can provide the alkaline developer desired for cleaning the glass substrate 47. The main component of the alkaline developer is a tetramethylammonium hydroxide (TMAH) solution in a concentration of between 0.35% and 0.45%, most preferably 0.4%. The two clean water nozzles 42 are respectively connected to a clean water supply source 49 (which provides such as deionized water) with pipelines and rinse the glass substrate 47 in a manner of high pressure spraying in combination with a mega sonic wave. During transporting the glass substrate 47, the delivering band 43 carries the glass substrate 47 to first pass the developer nozzle 41 for developer immersing about 30 to 50 seconds and then to pass the clean water nozzles 42 for clean water rinsing. Moreover, the recycling pipeline 44 disposed below the rinse unit 46 can recycle excess liquids during the glass substrate 47 is cleaned and separate the recycled liquids so as to reduce environment pollution and resource waste. After the glass substrate 47 is rinsed, it is transported by the delivering band 43 to the air scraper 45 for a dry treatment.

Figure 1:
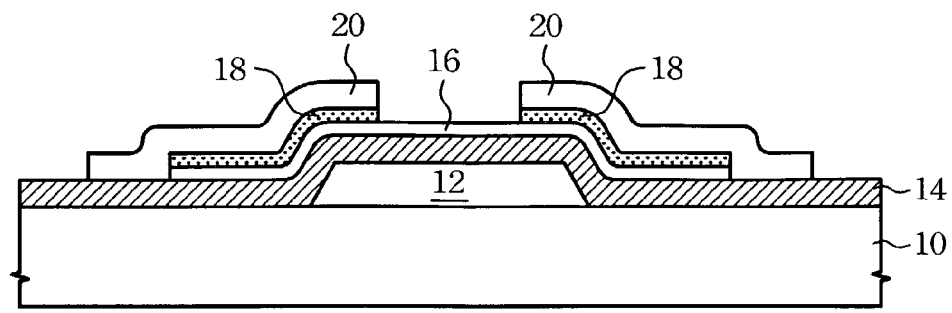
FIG. 1 is a sectional view of a thin film transistor formed on a glass substrate in the prior art.
Figure 2:
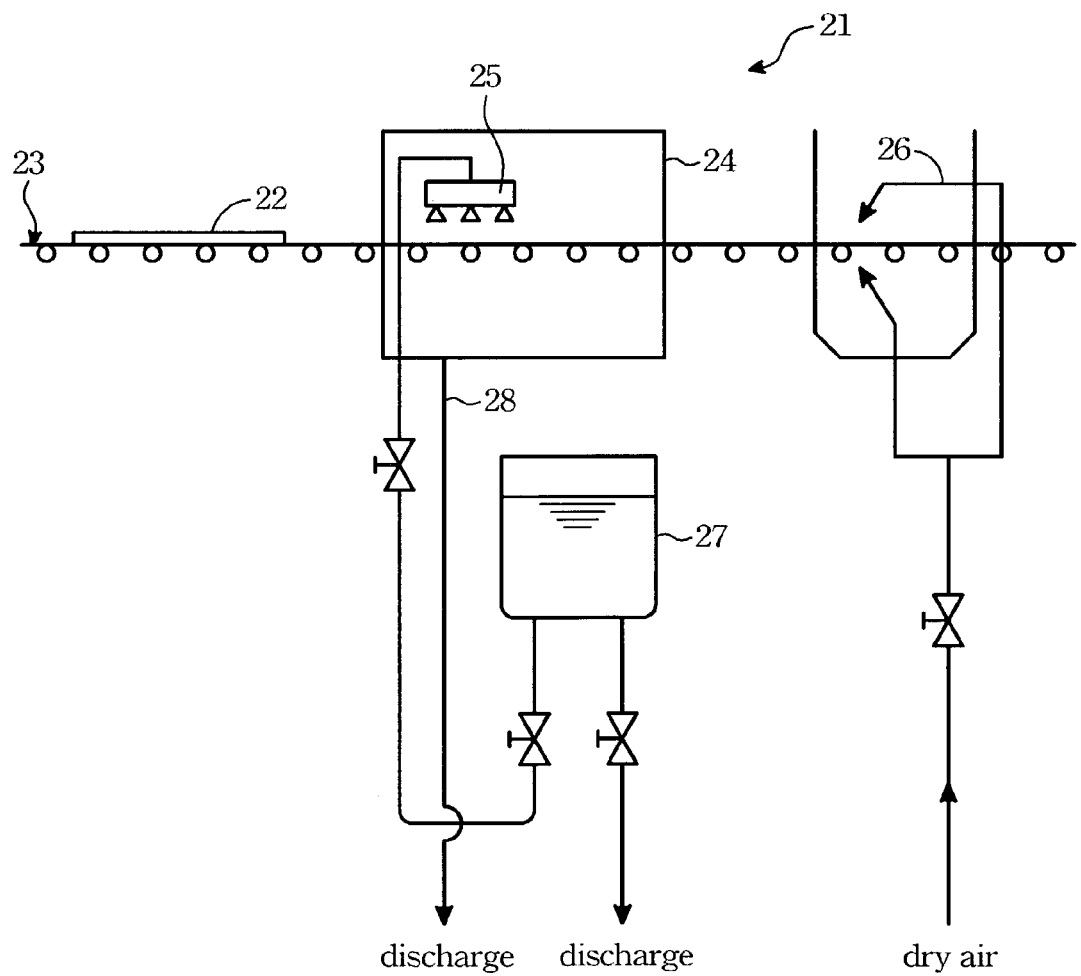
FIG. 2 is a schematic diagram of a conventional scrubber before a glass substrate is coated with a photoresist.

As compared with FIG. 2 of the prior art, it is noted that the cleaning apparatus of this invention has one of the clean water nozzles (most preferably the first one) in the prior art connected to a developer supply source with pipelines and provide the desired alkaline developer. Therefore, the improved cleaning apparatus of this invention can achieve the desired cleaning effects and reduce manufacturing costs and resource waste.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed:

1. A method for cleaning a glass substrate for removing oxide compounds and organic residues before a photoresist coating, wherein a metal film is formed on the surface of said glass substrate, said method comprising the steps of:
   providing an alkaline developer;
   immersing said metal film in said alkaline developer for a time between 30 seconds and 50 seconds;
   rinsing said metal film to remove the oxide compounds and organic residues from a surface of the metal film before the glass substrate is coated with a photoresist after immersed with clean water; and
   drying the surface of said metal film.

2. The cleaning method of claim 1, wherein said metal film is a metal film for forming a gate in said glass substrate.

3. The cleaning method of claim 2, wherein said metal film is made of the material selected from aluminum of aluminum alloy.

4. The cleaning method of claim 1, wherein said metal film is a metal film for forming a source and a drain in said glass substrate.

5. The cleaning method of claim 4, wherein said metal film is a composite metal film made of a tri-layer metal molybdenum/aluminum/molybdenum.

6. The cleaning method of claim 1, wherein said alkaline developer is a tetramethylammonium hydroxide (TMAH) solution.

7. The cleaning method of claim 6, wherein said tetramethylammonium hydroxide (TMAH) solution has a concentration of between 0.35% and 0.45%.

8. The cleaning method of claim 1, wherein said metal film is rinsed with clean water in a manner of high pressure spraying.

9. The cleaning method of claim 1, wherein said metal film is rinsed with clean water in combination with a mega sonic wave.

10. The cleaning method of claim 1, wherein the surface of said metal film is dried with an air scraper.

11. A method for cleaning a glass substrate before photoresist coating, comprising the step of immersing the glass substrate in an alkaline developer to remove oxide compounds and organic residues on a surface of a metal layer of the glass substrate before the glass substrate is coated with a photoresist.

* * * * *